US007629253B2

(12) United States Patent  (10) Patent No.: US 7,629,253 B2
Tanaka  (45) Date of Patent: Dec. 8, 2009

(54) METHOD FOR IMPLEMENTING DIFFUSION BARRIER IN 3D MEMORY

(75) Inventor: Yoichiro Tanaka, Santa Clara, CA (US)

(73) Assignee: Sandisk 3D LLC, Milpitas, CA (US)

( * ) Notice: Subject to any disclaimer, the term of this patent is extended or adjusted under 35 U.S.C. 154(b) by 37 days.

(21) Appl. No.: 11/731,579

(22) Filed: Mar. 30, 2007

(65) Prior Publication Data

US 2008/0242080 A1  Oct. 2, 2008

(51) Int. Cl.
  *H01L 21/44* (2006.01)
(52) U.S. Cl. .................... 438/653; 438/652; 438/597; 438/584; 257/E21.294
(58) Field of Classification Search .......... 257/E21.294; 438/584, 597, 652, 653
  See application file for complete search history.

(56) References Cited

U.S. PATENT DOCUMENTS

| | | | |
|---|---|---|---|
| 5,470,789 A | 11/1995 | Misawa | |
| 5,602,053 A | 2/1997 | Zheng et al. | |
| 5,614,756 A * | 3/1997 | Forouhi et al. | ............... 257/530 |
| 5,835,396 A | 11/1998 | Zhang | |
| 6,376,353 B1 * | 4/2002 | Zhou et al. | .................. 438/612 |
| 6,420,215 B1 | 7/2002 | Knall et al. | |
| 6,436,817 B2 | 8/2002 | Lee | |
| 6,734,559 B1 | 5/2004 | Yang et al. | |
| 6,751,149 B2 * | 6/2004 | Seyyedy et al. | .......... 365/225.7 |
| 6,770,491 B2 * | 8/2004 | Tuttle | ............................. 438/3 |
| 6,887,781 B2 * | 5/2005 | Lee et al. | .................... 438/627 |
| 6,946,719 B2 | 9/2005 | Petti et al. | |
| 6,951,780 B1 | 10/2005 | Herner | |
| 6,952,030 B2 | 10/2005 | Herner et al. | |
| 6,960,495 B2 | 11/2005 | Vyvoda et al. | |
| 6,965,156 B1 | 11/2005 | Hawley et al. | |
| 6,984,561 B2 | 1/2006 | Herner et al. | |
| 6,995,422 B2 | 2/2006 | Herner et al. | |
| 7,009,275 B2 | 3/2006 | Herner et al. | |
| 7,026,212 B2 | 4/2006 | Herner et al. | |
| 2003/0062596 A1 * | 4/2003 | Hawley et al. | ............... 257/530 |
| 2004/0029296 A1 * | 2/2004 | Tuttle | ............................. 438/3 |
| 2005/0012154 A1 | 1/2005 | Herner et al. | |
| 2006/0249753 A1 | 11/2006 | Herner et al. | |
| 2006/0251872 A1 | 11/2006 | Wang et al. | |
| 2007/0210414 A1 | 9/2007 | Iwamoto et al. | |

OTHER PUBLICATIONS

PCT Search Report for Application No. PCT/US2008/058358 filed Mar. 27, 2008.
Office Action dated Jan. 12, 2009 for U.S. Appl. No. 11/731,676.
Office Action dated Apr. 16, 2009 for U.S. Appl. No. 11/731,676.

* cited by examiner

*Primary Examiner*—Bradley K Smith
*Assistant Examiner*—Marvin Payen
(74) *Attorney, Agent, or Firm*—Cooper Legal Group LLC

(57) ABSTRACT

One or more diffusion barriers are formed around one or more conductors in a three dimensional or 3D memory cell. The diffusion barriers allow the conductors to comprise very low resistivity materials, such as copper, that may otherwise out diffuse into surrounding areas, particularly at elevated processing temperatures. Utilizing lower resistivity materials allows device dimension to be reduced by mitigating increases in resistance that occur when the size of the conductors is reduced. As such, more cells can be produced over a given area, thus increasing the density and storage capacity of a resulting memory array.

25 Claims, 16 Drawing Sheets

METHOD FOR IMPLEMENTING DIFFUSION BARRIER IN 3D MEMORY

CROSS REFERENCE TO RELATED APPLICATION(S)

This application is related to U.S. patent application Ser. No. 11/731,676, entitled "Implementation of Diffusion Barrier in 3D Memory" to Yoichiro Tanaka, filed on Mar. 30, 2007, the entirety of which is hereby incorporated by reference herein.

FIELD

The disclosure herein relates generally to semiconductor processing, and more particularly to implementing a diffusion barrier in 3D memory.

BACKGROUND

An ongoing desire in the semiconductor industry is to increase the storage capacity of memory devices. This has given rise to three dimensional or 3D memory.

Such memory can be improved, however, to achieve even higher densities.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

In a three dimensional or 3D memory cell, one or more diffusion barriers are formed around one or more conductors. The diffusion barriers allow the conductors to comprise very low resistivity materials, such as copper, that may otherwise out diffuse into surrounding areas, particularly at elevated processing temperatures. Utilizing lower resistivity materials allows device dimension to be reduced by mitigating increases in resistance that occur when the size of the conductors is reduced. As such, more cells can be produced over a given area, thus increasing the density and storage capacity of a resulting memory array.

To the accomplishment of the foregoing and related ends, the following description and annexed drawings set forth certain illustrative aspects. Other aspects, advantages and/or features may, however, become apparent from the following detailed description when considered in conjunction with the annexed drawings.

DETAILED DESCRIPTION

Figure 1:
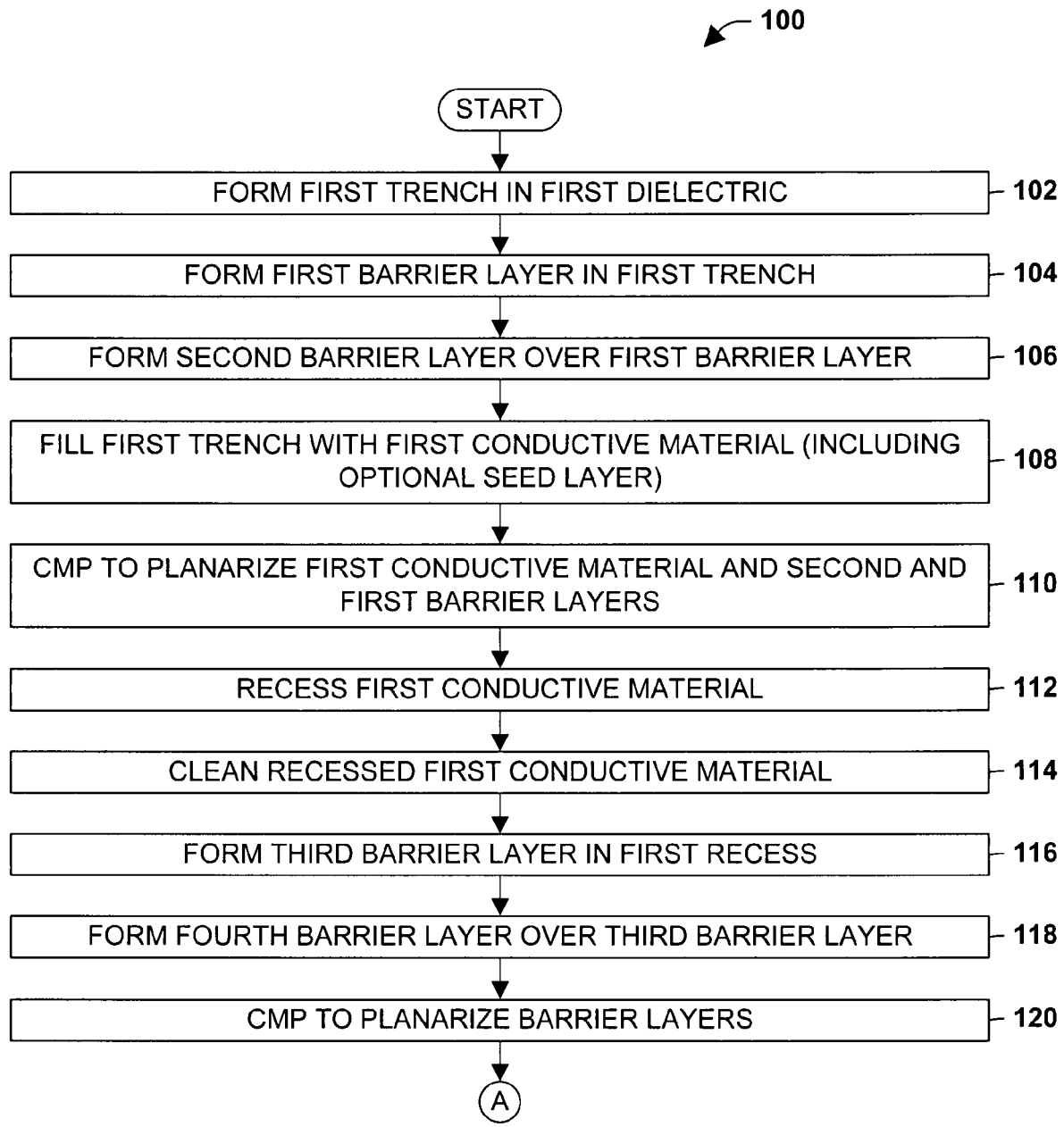
FIGS. 1-3 comprise a flow diagram illustrating an example methodology for implementing a diffusion barrier in a 3D memory cell.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Figure 2:
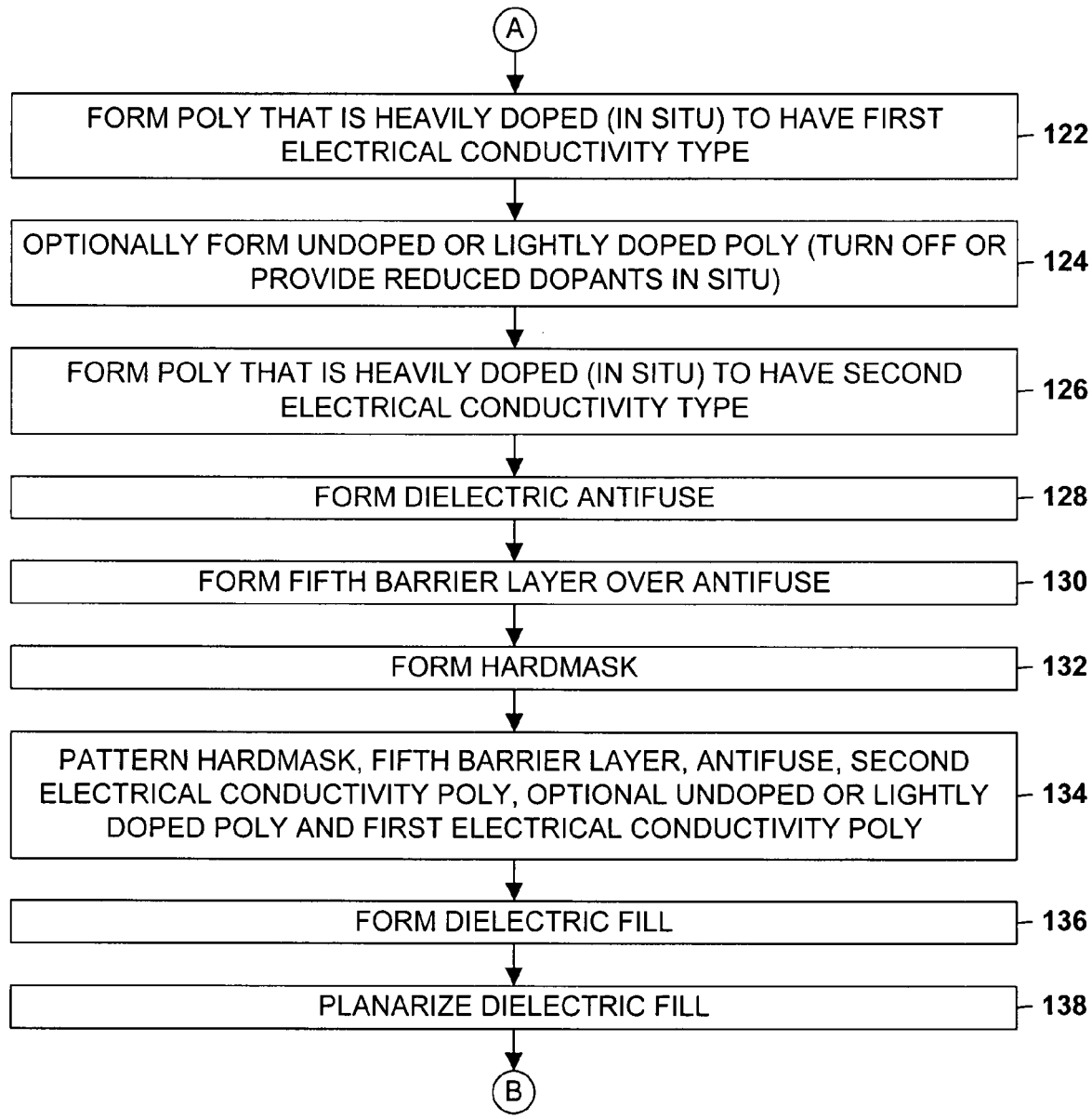
Figure 3:
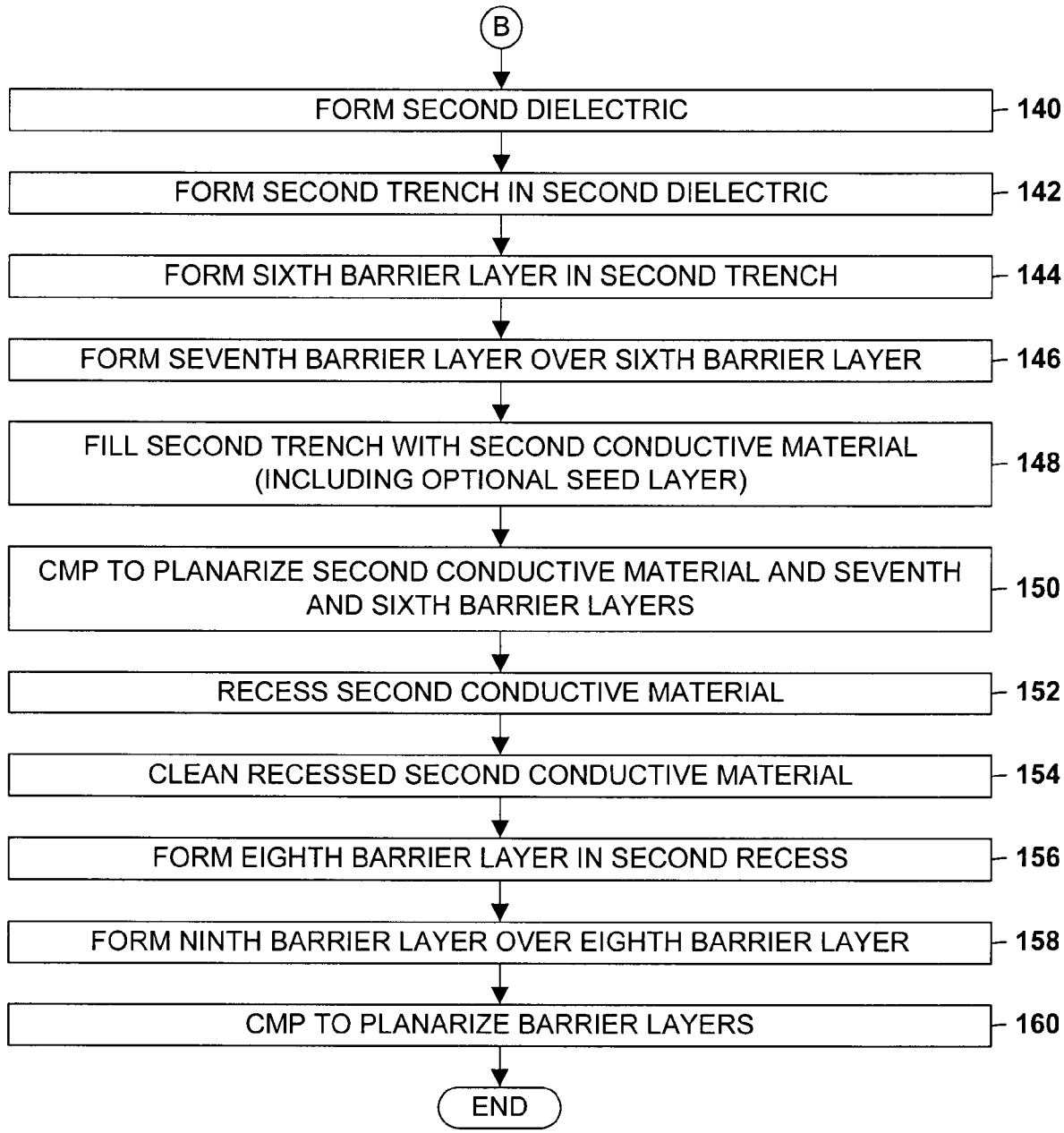

An example methodology 100 for forming a 3D memory cell where one or more diffusion barriers are formed around conductors of the cell is illustrated in FIGS. 1-3, and an example semiconductor substrate 200 where-over such a methodology is implemented is illustrated primarily in cross-sectional view in FIGS. 4-27. As will be appreciated, forming one or more diffusion barriers around the conductors facilitates greater storage capacity by allowing very low resistivity materials to be used for the conductors, where such low resistivity materials mitigate at least some drawbacks associated with shrinking device dimensions to increase packing densities. While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 4:
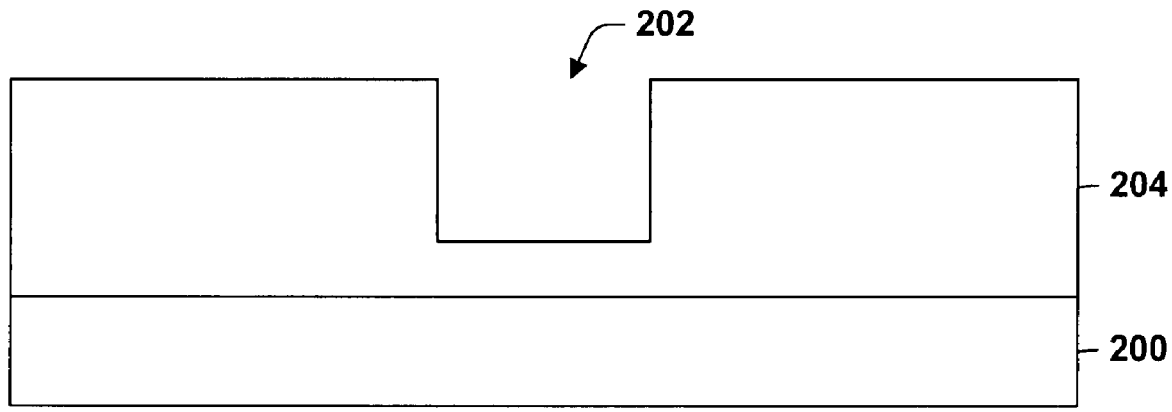
FIGS. 4-15 are cross-sectional views of an example semiconductor substrate illustrating the formation thereover of a first conductor and a pillar of a 3D memory cell, where one or more diffusion barriers are formed around the first conductor.

At the outset, a first trench 202 is formed (e.g., etched) within a first dielectric 204 at 102, where the first dielectric 202 is formed over the substrate 200 and may comprise nitride and/or oxide-based materials, for example (FIG. 4). It will be appreciated that substrate and/or semiconductor substrate as used herein may comprise any type of semiconductor body (e.g., silicon, SiGe, SOI) such as a semiconductor wafer and/or one or more die on a wafer, as well as any other type of semiconductor and/or epitaxial layers formed thereover or otherwise associated therewith. It will also be appreciated that since the memory cell need not contact the substrate 200, the substrate 200 beneath the cell is available for other uses, such as laying out row decoders, column decoders, I/O multiplexers, and/or read/write circuitry, for example. This promotes area efficiency with regard to valuable semiconductor real estate.

Figure 5:
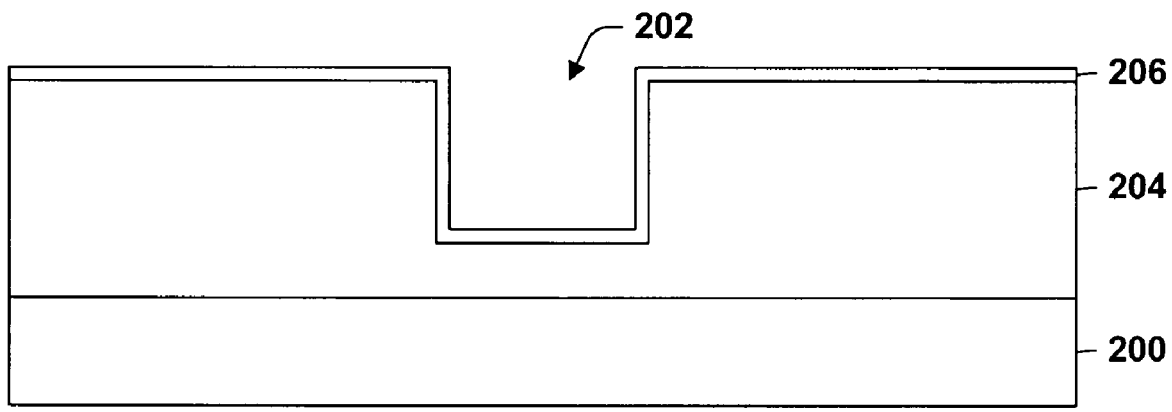
Figure 6:
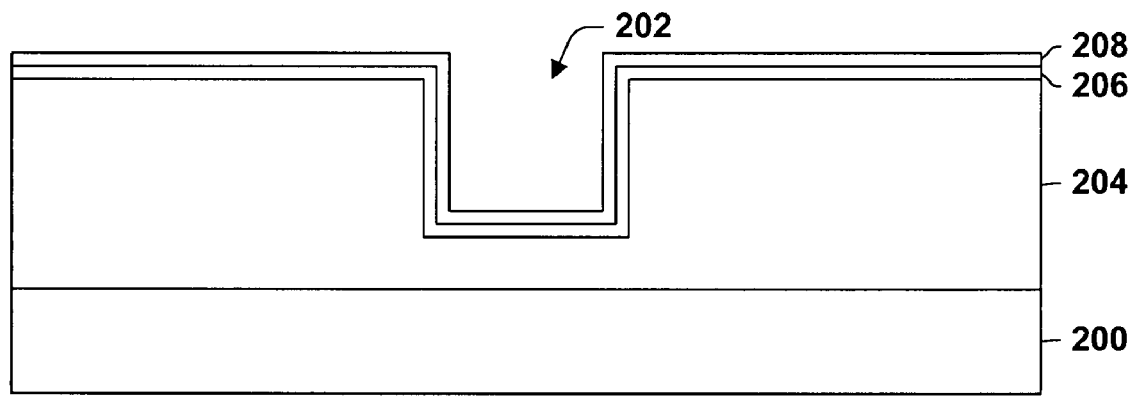

At 104, a first layer of diffusion barrier material 206 is formed over the first dielectric 204 so as to line the first trench 202 (FIG. 5). A second layer of diffusion barrier material 208 is then formed over the first layer of diffusion barrier material 206 thus also lining the first trench 202 (FIG. 6). The first and second layers of diffusion barrier material 206, 208 can comprise any one or more of the following Ta, TaN, W, WN, TiN, TiSiN, Ru, Mo, Cr, Rh, Re, TaSiN, WSiN, TiW, Ta—W and Ta—Ru, for example.

The first and second layers of diffusion barrier material 206, 208 can be formed by a deposition process, such a physical vapor deposition (PVD) and/or chemical vapor deposition (CVD), for example, so that they have a substantially uniform thickness along the sidewalls and bottom of the trench 202. Additionally, while two layers of diffusion barrier material are illustrated, a single layer of diffusion barrier material may be implemented. Two layers of diffusion barrier material may be advantageous, however, because the first layer of diffusion barrier material 206 may provide better adhesion to the dielectric 204, while the second layer of diffusion barrier material 208 may exhibit greater diffusion barrier characteristics, for example. Also, where one of the layers of diffusion barrier material 206, 208 has a higher resistivity, for example, then that layer can be made substantially thinner. For example, if the first layer of diffusion barrier material 206 changes phases during the deposition process (affecting its lattice structure) so that it becomes more resistive, then that layer can be formed to a thickness that is about 1/10 of the thickness of the second layer of diffusion barrier material 208, for example. In this manner, degradation of the overall conductivity of the resulting device is substantially mitigated.

Figure 7:
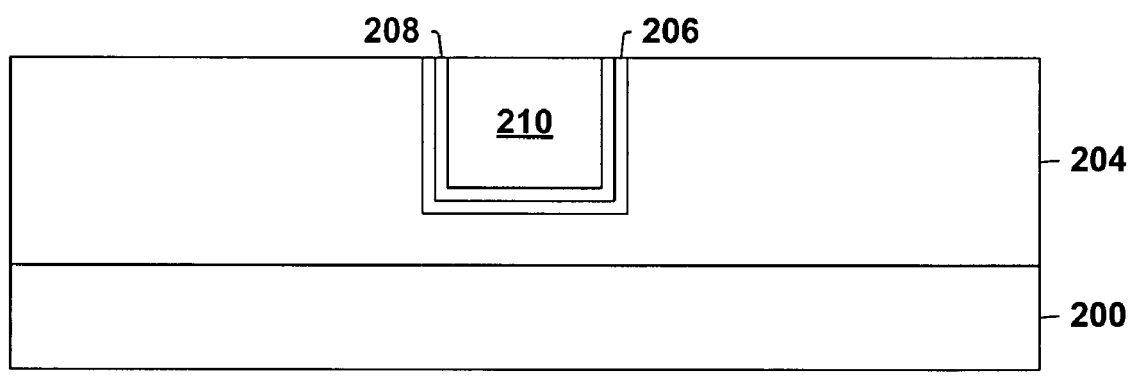

The first trench 202 is then filled with a very low resistivity first conductor 210, such as copper, for example, at 108 (FIG. 7). This may include forming a seed layer of pure copper followed by an electroplating process to fill the remainder of the first trench 202 with copper, for example. Such a seed layer is a relatively thin (e.g., about 50 nm) highly conductive layer that adheres well to the diffusion barrier material lining the first trench 202, and can be formed by a deposition process, such as physical vapor deposition (PVD), for example. The electroplating process can be performed in a chemical bath to fill the trench 202 from the bottom up with copper. In one example, the first conductor has a width of about 45 nm. With the first trench 202 filled with the first conductor 210, second layer of diffusion barrier material 208 and first layer of diffusion barrier material 206, a chemical mechanical polishing (CMP) process is performed at 110 to remove excess amounts of these materials 210, 208, 206 and expose the first dielectric 202 (FIG. 7). As a result, the materials 210, 208, 206 filling the first trench 202 are substantially flush with the top surface of the dielectric 204.

Figure 8:
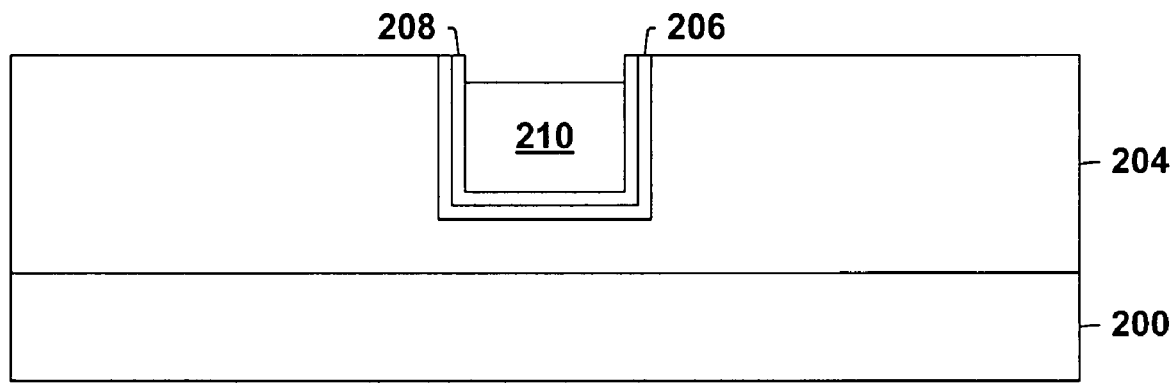

The first conductor 210 is then recessed slightly at 112 (FIG. 8). For example, if the height of the first conductor 210 is about 50 nm, then about 5 nm or about 10% of the first conductor 210 can be removed. One or more techniques can be implemented to recess the first conductor 210. For example, deplating, wet etching and/or chemical mechanical polishing (CMP) can be employed. With deplating, a (reverse) bias is applied to the first conductor 210 along with some light chemicals to remove some of the (upper ions) of the first conductor 210. Sulfuric peroxide can be used to wet etch the first conductor 210. Also, a CMP process can be allowed to run for a slightly extended duration to over polish or dish the first conductor 210.

Figure 9:
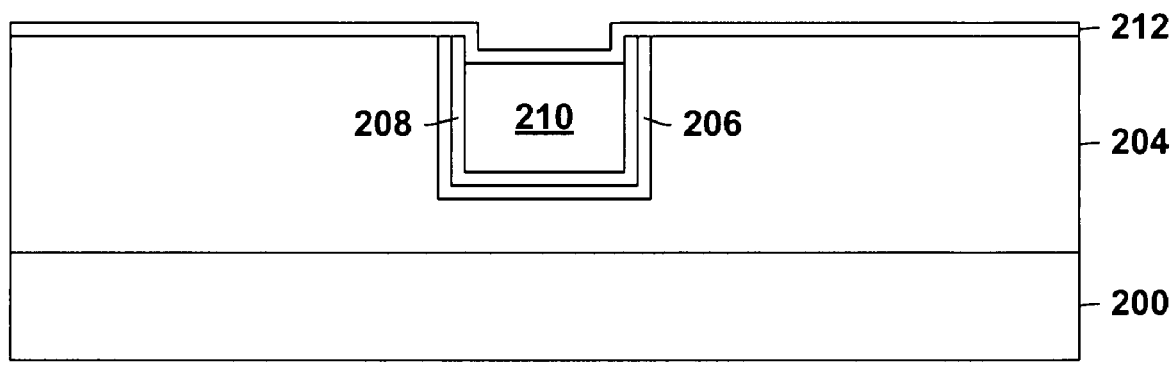
Figure 10:
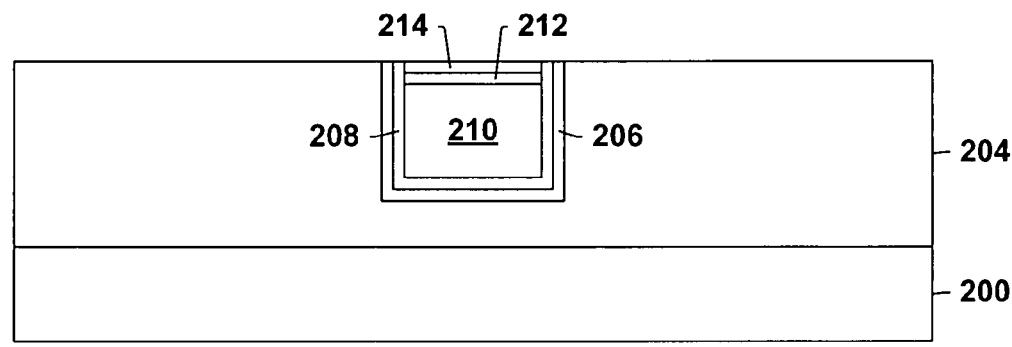

When the first conductor 210 is exposed to the atmosphere some oxidation may occur. Accordingly, the first conductor 210 is cleaned at 114, such as with an argon sputter and/or hydrogen reactive clean, for example. A third layer of diffusion barrier material 212 is formed over the dielectric 204 and recessed first conductor 210 at 116 (FIG. 9). A fourth layer of diffusion barrier material 214 is then formed over the third layer of diffusion barrier material 212 at 118 (FIG. 10). The third and fourth layers of diffusion barrier material 212, 214 can comprise any one or more of the following Ta, TaN, W, WN, TiN, TiSiN, Ru, Mo, Cr, Rh, Re, TaSiN, WSiN, TiW, Ta—W and Ta—Ru, for example. Also like the first and second layers of diffusion barrier material 206, 208, the third and fourth layers of diffusion barrier material 212, 214 are planarized (e.g., by CMP) at 120 to be flush with the top surface of the first dielectric 204 (FIG. 10).

It can be appreciated that the third and fourth diffusion barriers 212, 214 effectively cap the first conductor 210. While the third and fourth diffusion barriers 212, 214 are illustrated, it will be appreciated that a single diffusion barrier can be formed over the first conductor 210. As with the first and second diffusion barriers 206, 208, however, it may be advantageous to have two diffusion barriers 212, 214 because diffusion barrier 212 may exhibit greater diffusion barrier characteristics, while diffusion barrier 214 may afford better adhesion to subsequently applied materials, for example. Also like the first and the second diffusion barriers 206, 208, the respective thicknesses of the third and fourth diffusion barriers 212, 214 may be adjusted as necessary to mitigate resistivity. It can be appreciated that the first diffusion barrier 206 and the fourth diffusion barrier 214 may comprise the same material (or composition of materials), while the second diffusion barrier 208 and the third diffusion barrier 212 may comprise the same material (or composition of materials). In this manner, the first conductor 210 is effectively surrounded by the same material (or composition of materials) 208, 212, with this material 208, 212 surrounded by another material (or composition of materials) 206, 214.

Figure 11:
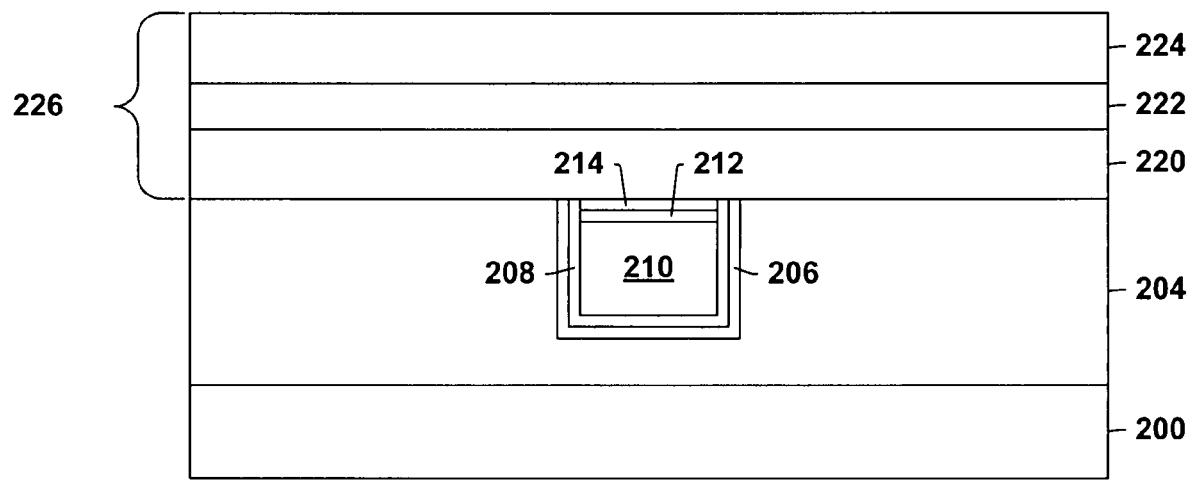

At 122, a first layer of heavily doped semiconductor material 220, such as polysilicon, for example, is formed over the first dielectric 204 and the first, second and fourth diffusion barriers 206, 208, 214 (FIG. 11). The polysilicon 220 may be doped as it is formed (in situ) and/or implanted with dopants after it is formed to have a first electrical conductivity type (e.g., n type or p type). A layer of undoped or lightly doped polysilicon 222 may then optionally be formed over the first layer of heavily doped polysilicon 220 at 124 (FIG. 11). This may merely comprise turning off or substantially reducing the flow of dopant gases administered into a processing chamber, for example. Regardless of whether layer 222 is formed, a second layer of heavily doped semiconductor material 224, such as polysilicon, for example, is then formed at 126 (FIG. 11). The polysilicon 224 may likewise be doped as it is formed (in situ) and/or implanted with dopants after it is formed to have a second electrical conductivity type (e.g., p type or n type). For purposes of simplicity, layers 220, 222, 224 are collectively referred to herein (and illustrated in most of the Figs.) as a single layer, namely 226.

It will be appreciated that layers 220, 222, 224 may be formed by a deposition process, such as chemical vapor deposition (CVD), for example, and may be subjected to elevated temperatures, such as greater than about 500° C., for example, during their formation to effect crystallization and/or dopant activation, for example. Subjecting the first conductor 210 to such elevated temperatures may cause this material to soften and diffuse out into the surrounding regions, such as the first dielectric 204, for example. This is undesirable, at least, because the first of dielectric 204 is intended to remain substantially nonconductive, and increasing its conductivity (with out diffused conductive material from the first conductor 210) may lead to short circuits (with neighboring devices). Accordingly, implementing diffusion barriers as described herein mitigates such out diffusion and allows very low resistivity materials, such as copper, to be used for the first conductor 210, even though such low resistivity materials may have a greater propensity to out diffuse as processing temperatures are increased.

Utilizing very low resistivity materials for the first conductor 210 is desirable, at least, because they allow device dimensions to be reduced, which enhances area utilization by allowing more memory cells to be produced within a given area, which in turn increases storage capacity. More particularly, utilizing very low resistivity materials allows the resistivity of the first conductor 210 to remain relatively low when the size of the first conductor 210 is reduced, where the resistivity of a conductor generally increases when its cross-sectional area is reduced. Similarly, one or more agents, such as germanium or a germanium alloy, do not need to be added to layers 220, 222 and/or 224 to reduce the temperatures at which crystallization occurs, for example. In the absence of diffusion barriers 206, 208, 212, 214, such agents may need to be added to layers 220, 222 and/or 224, however, to mitigate out diffusion (e.g., by reducing processing temperatures needed to achieve crystallization, for example). Nevertheless, any suitable additives may be imparted to layers 220, 222 and/or 224.

Figure 12:
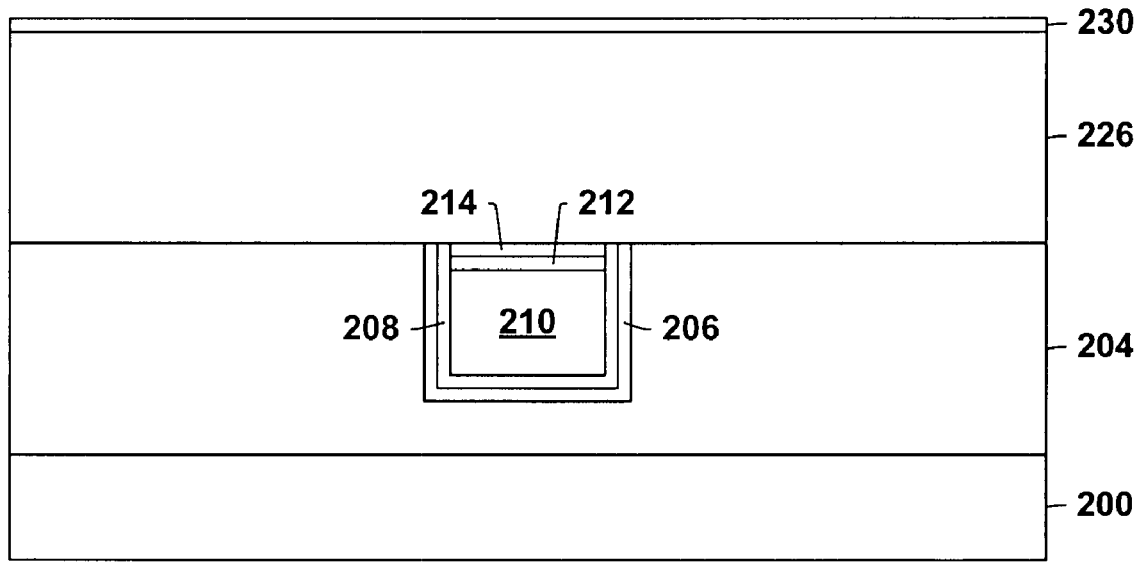

A layer of dielectric antifuse material 230 is then formed over layer 226 at 128 (FIG. 12). The layer of dielectric antifuse material 230 may comprise oxide, carbon, silicon and/or nitride-based materials, for example, and maybe formed by growth and/or deposition processes, such as rapid thermal processing (RTP) chemical vapor deposition (CVD), liquid phase deposition, hot steam oxidation, dry thermal oxidation, plasma-oxidation, wet-chemical oxidation and/or electrochemical oxidation, for example. The layer of dielectric antifuse material 230 is significantly thinner than the semiconductor layer 226. For example, layer 226 may be about 100 times thicker than layer 230.

Figure 13:
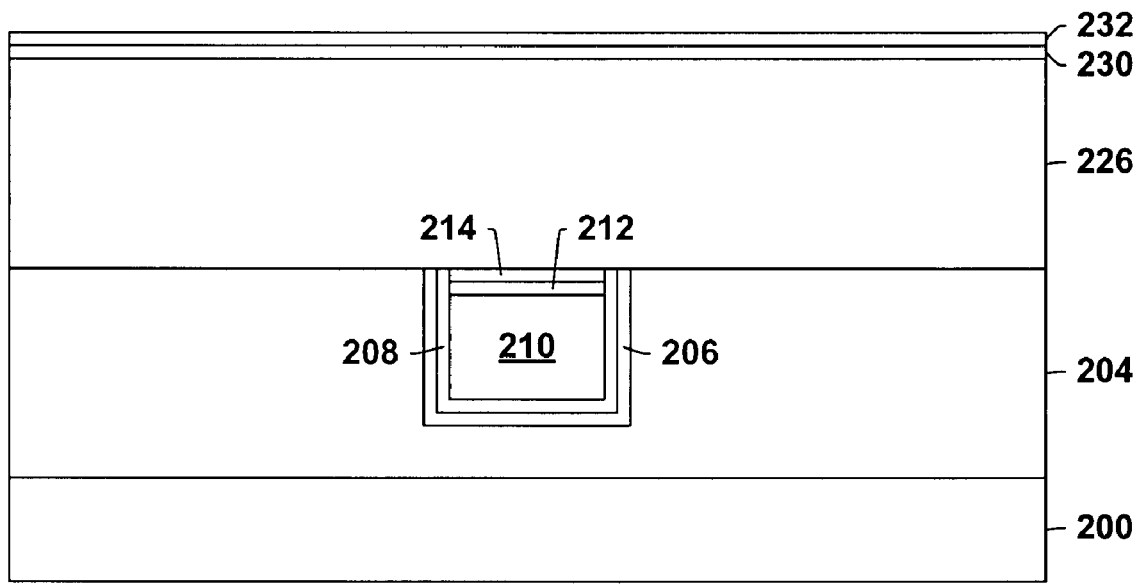
Figure 14:
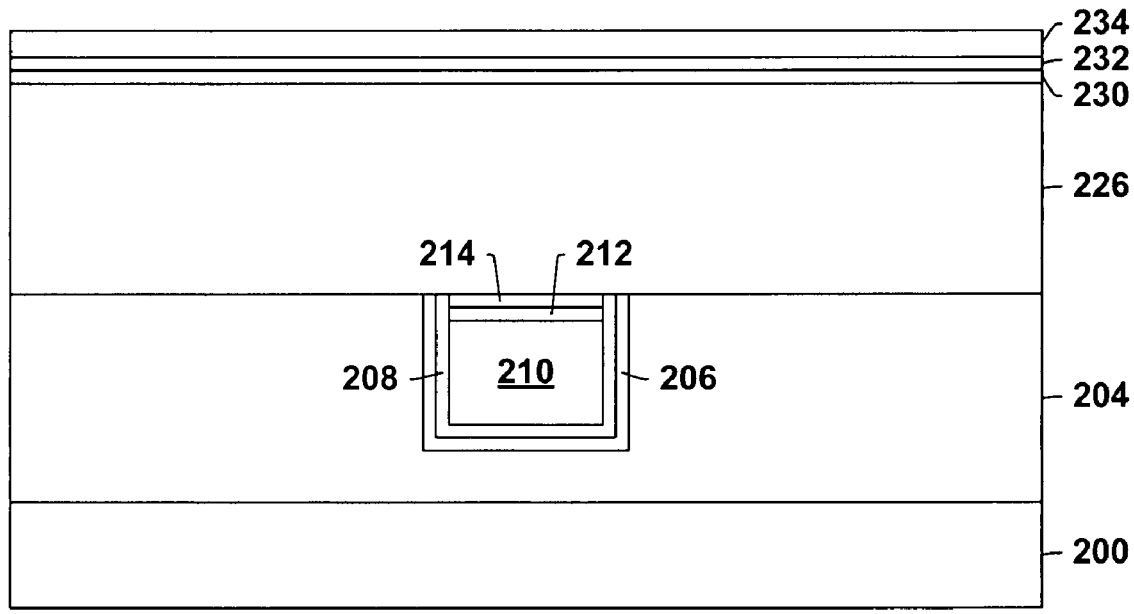

A fifth layer of diffusion barrier material 232 is formed over the layer of dielectric antifuse material 230 at 130 (FIG. 13). The fifth layer of diffusion barrier material 232 can comprise any one or more of the following Ta, TaN, W, WN, TiN, TiSiN, Ru, Mo, Cr, Rh, Re, TaSiN, WSiN, TiW, Ta—W and Ta—Ru, for example, and can be formed by deposition and/or growth processes, for example. At 132, a layer of hardmask material 234 is formed over the fifth layer of diffusion barrier material 232 (FIG. 14). The layer of hardmask material 234 is relatively thick (e.g., between about 600 Å and about 700 Å) and may comprise any one or more of the following Ta, TaN, W, WN, TiN, TiSiN, Ru, Mo, Cr, Rh, Re, TaSiN, WSiN, TiW, Ta—W and Ta—Ru, for example, and can be formed by deposition and/or growth processes, for example. As will be appreciated, a motivation for making the layer of hardmask material 234 relatively thick is so that it can serve as an etch and/or CMP stop during subsequent processing. Since the layer of hardmask material 234 is relatively thick, however, it may be advantageous to have this layer comprise one or more lower resistivity materials to mitigate the overall resistivity of this layer. For example, the layer of hardmask material 234 may comprise W, TiW and/or Ta. Additionally, the layer of hardmask material 234 may comprise multiple layers (as may other layers disclosed herein). For example, the layer of hardmask material 234 may comprise Ta over top of TaN, where the Ta has a low resistivity when grown on top of TaN.

Figure 15:
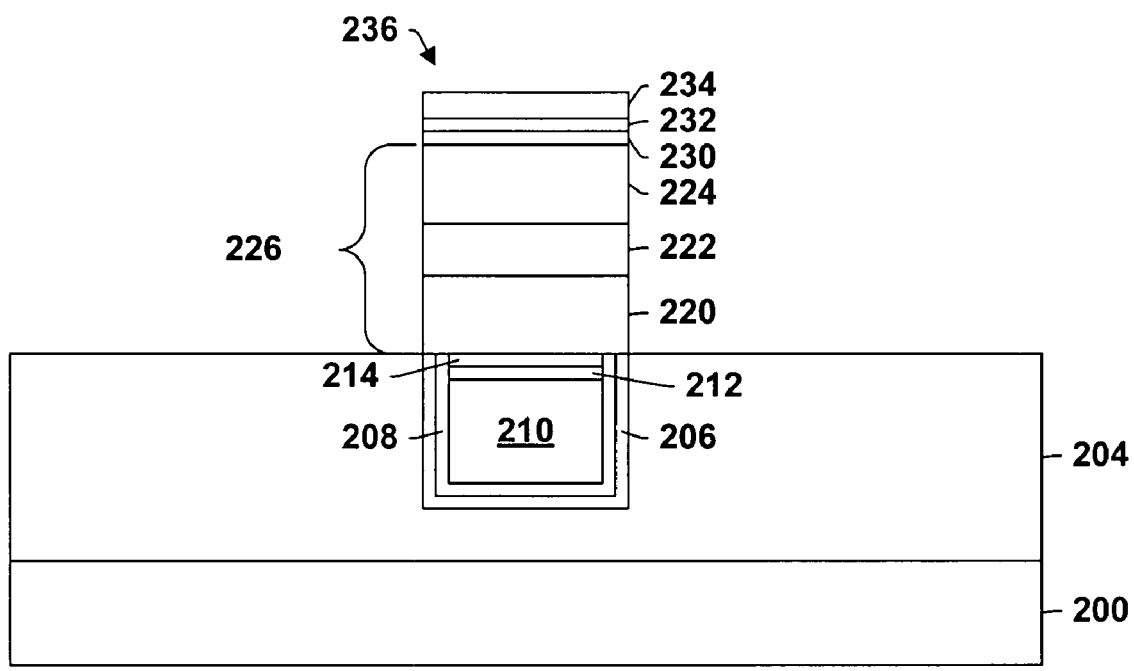

At 134, the layer of hardmask material 234, fifth layer of diffusion barrier material 232, layer of dielectric antifuse material 230, second layer of heavily doped semiconductor material 224, optional layer of lightly doped or undoped semiconductor material 222 and first layer of heavily doped semiconductor material 220 are then patterned to form a pillar 236 over the first conductor 210 (FIG. 15). The pillar 236 thus comprises a hardmask 234, a fifth diffusion barrier 232, a dielectric antifuse 230 and a semiconductor 226 having multiple dopings. It will be appreciated that this, as well as other patterning described herein, can be performed with lithographic techniques, where lithography refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

Should some mis-alignment occur (e.g., due to masking offsets, etc.) when forming the pillar 236, it will be appreciated that the diffusion barriers 206, 208, 212 and/or 214 also serve as an etch stop to mitigate shorting between the first conductor 210 and the pillar 236, and more particularly the semiconductor 226 of the pillar 236. That is, the etchant used to pattern layers 234, 232, 230, 224, 222 and 220 is selective to diffusion barriers 206, 208, 212 and 214 so that it removes layers 234, 232, 230, 224, 222 and 220 much more quickly than it etches the barriers 206, 208, 212 and 214. As such, should the pillar be moved to the left or right so that barriers 206, 208, 212 and/or 214 are exposed to the etchant, little to none of the barriers 206, 208, 212 and 214 will be removed before the etching process is completed. The first conductor 210 will thus remain contained within barriers 206, 208, 212 and 214 even if the pillar is offset from the first conductor 210.

Figure 16:
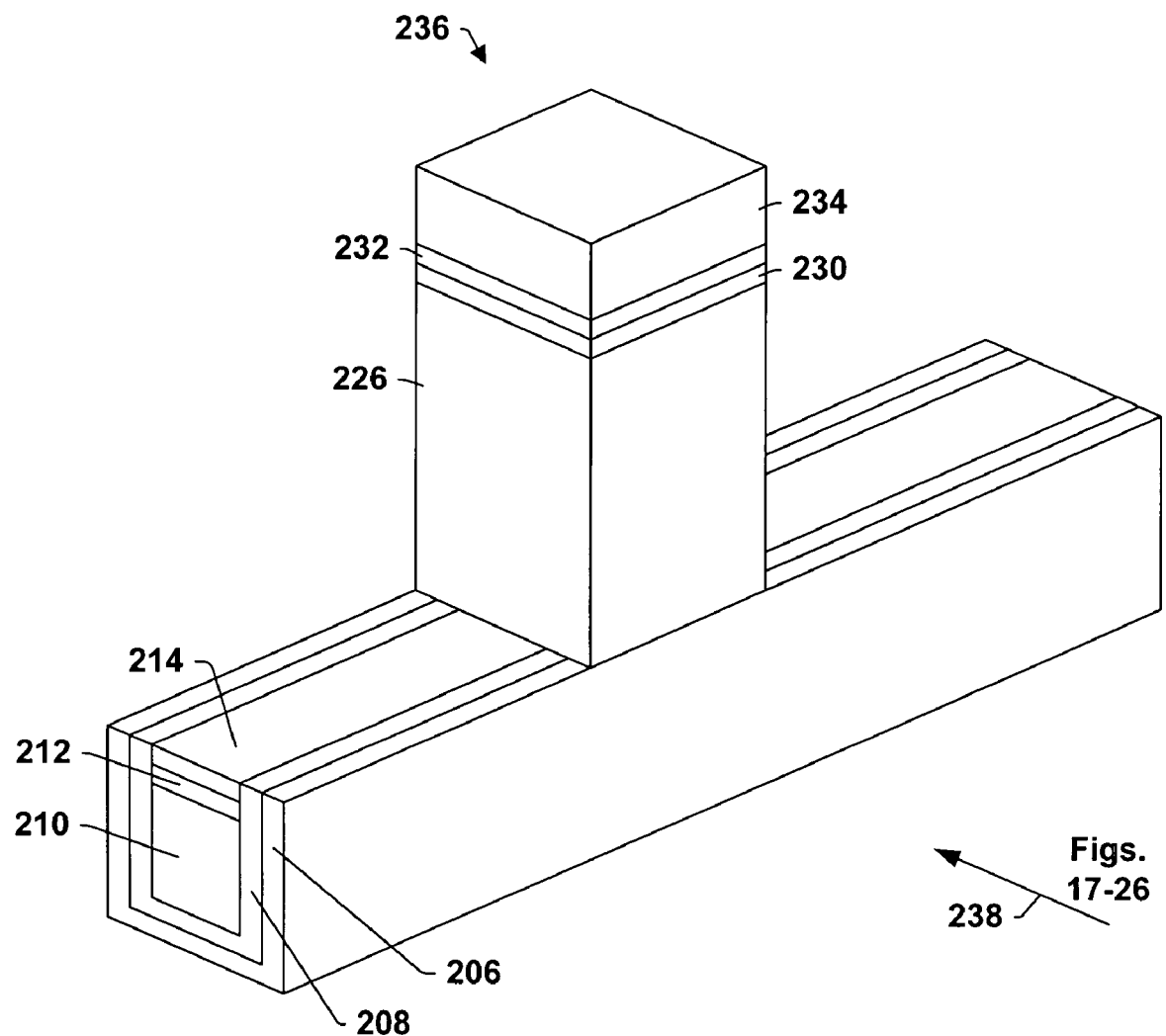
FIG. 16 is a perspective view of a first conductor and a pillar of a 3D memory cell, where one or more diffusion barriers are formed around the first conductor.
Figure 17:
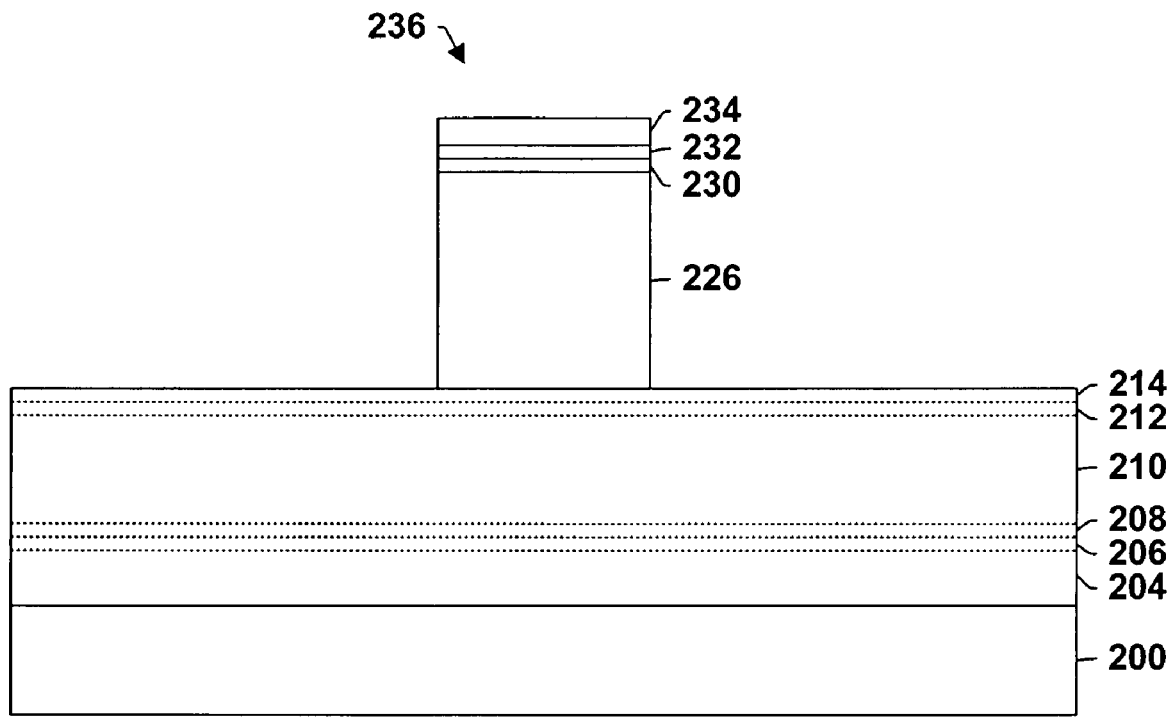
FIGS. 17-26 are cross-sectional views of an example semiconductor substrate illustrating the formation of a second conductor over a pillar of a 3D memory cell, where one or more diffusion barriers are formed around the second conductor.

FIG. 16 is a perspective view of the pillar 236 overlying the first conductor 210 and surrounding diffusion barriers 206, 208, 212 and 214. It can be seen that the pillar 236 has a substantially square cross section, while the first conductor 210 extends in a first direction. It can be appreciated that to form an array of memory cells, multiple conductors and surrounding barrier layers can be formed in the same manner, concurrently with and substantially parallel to the first conductor 210, and then layers 234, 232, 230, 224, 222 and 220 can be patterned so that the respective conductors have multiple spaced apart pillars formed thereover. FIGS. 17-26 are cross-sectional views of the memory cell as viewed from arrow 238 in FIG. 16. FIG. 17 merely illustrates the structure of FIG. 15 from this perspective (e.g., rotated about 90°—with 220, 222 and 224 illustrated as single layer 226).

Figure 18:
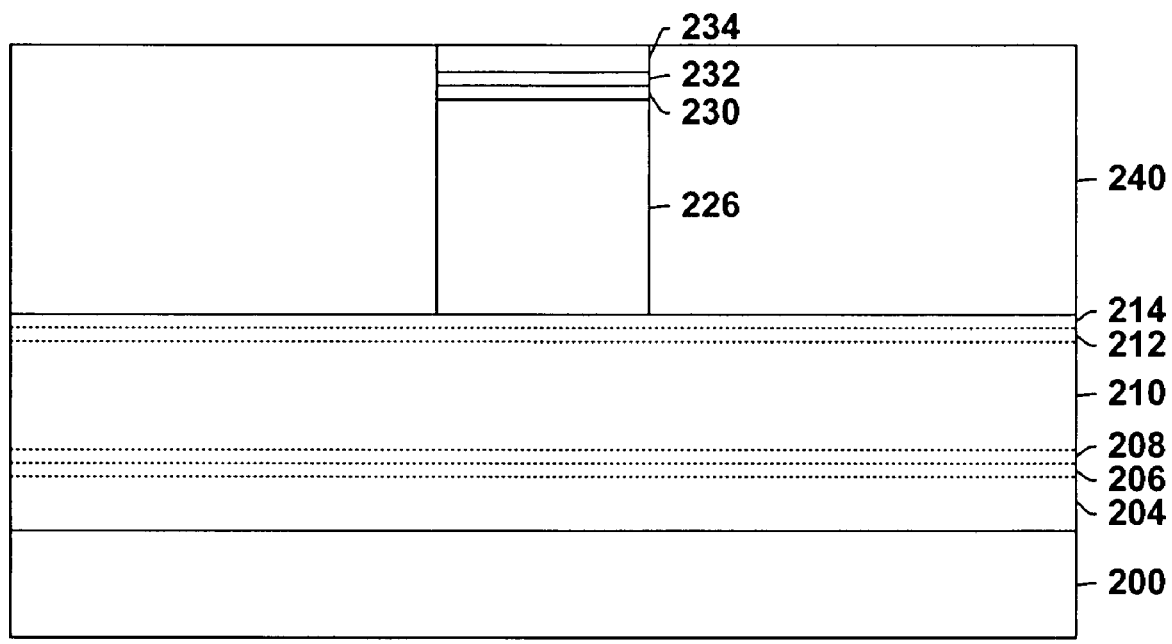
Figure 19:
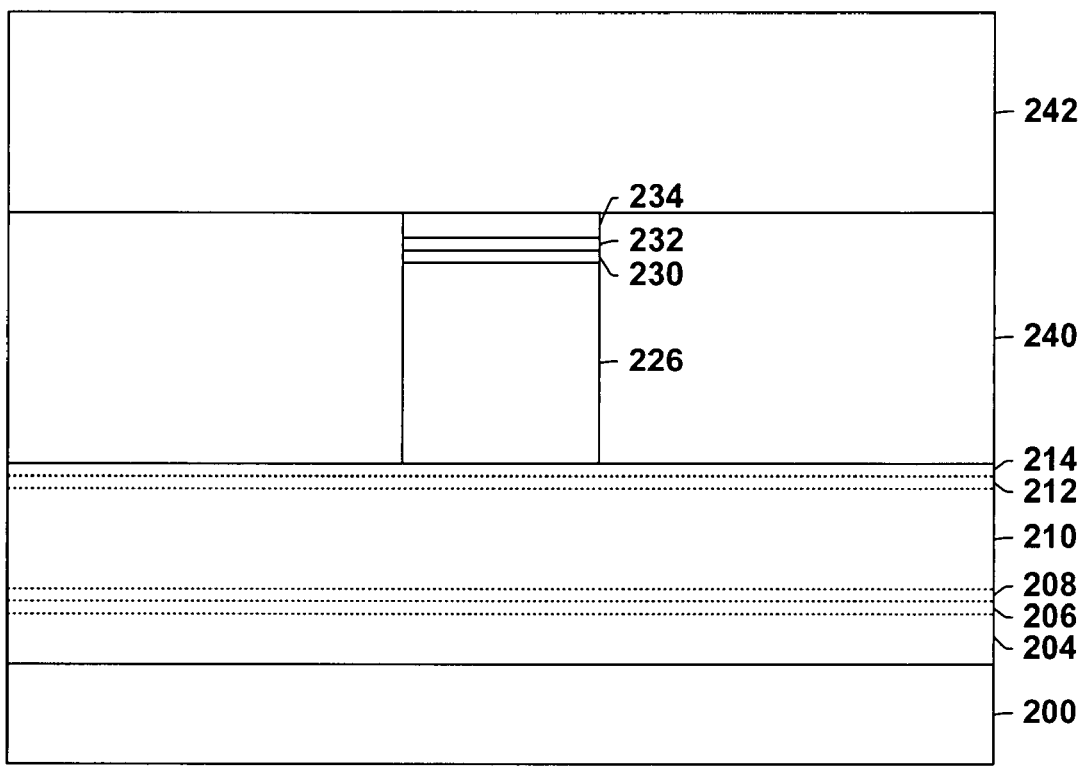
Figure 20:
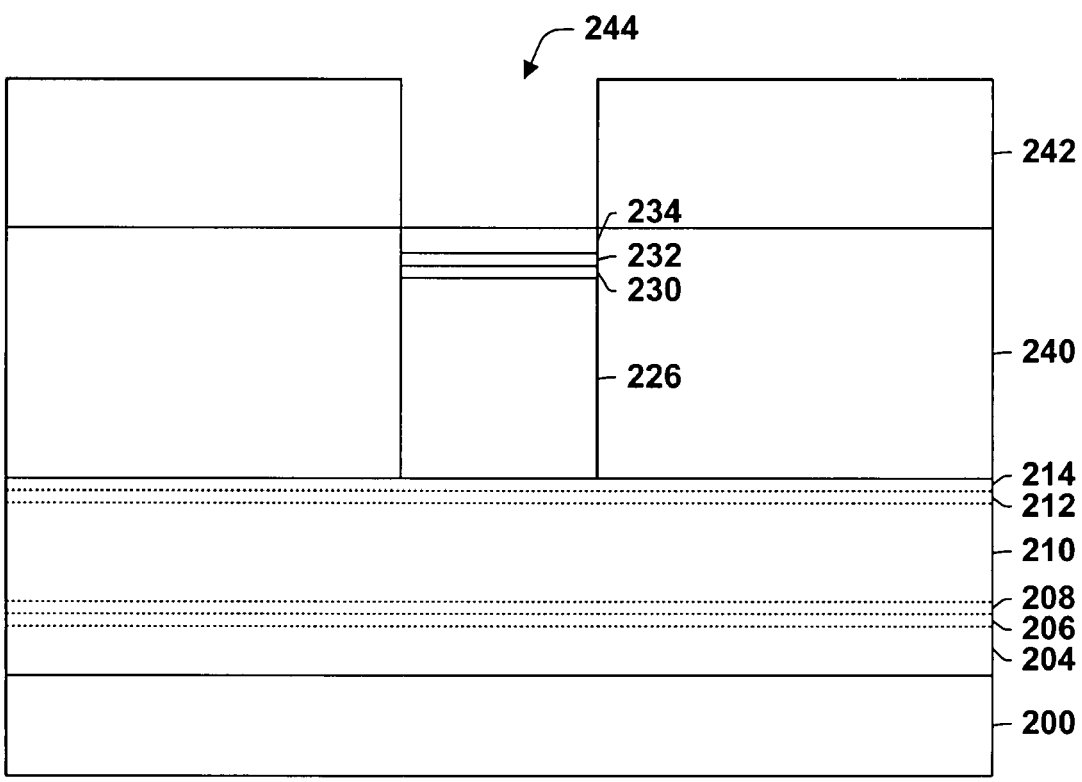

At 136, a dielectric fill 240 is performed to essentially electrically isolate the pillar 236 from surrounding devices (e.g., other pillars—not shown) (FIG. 18). The dielectric fill 240 may comprise any suitable dielectric material, such as silicon dioxide, spin on glass (SOG) and/or a nitride based material, for example. The dielectric fill 240 is planarized (e.g., via CMP) to be substantially flush with the top of the pillar 236 at 138 (FIG. 18). It will be appreciated that the hardmask 234 acts as a CMP stop during the planarization at 138 to mitigate undesired removal (or other disturbance) of the pillar 236. A second dielectric 242 is formed over the fill material 240 and the pillar 236 at 140 (FIG. 19). The second dielectric 242 may similarly comprise any suitable dielectric materials, such as oxide and/or nitride based materials, for example. A second trench 244 is formed (e.g., etched) within the second dielectric 242 at 142 (FIG. 20). The hardmask 234 again serves to protect the pillar 236 by serving as an etch stop for the patterning performed at 142.

Figure 21:
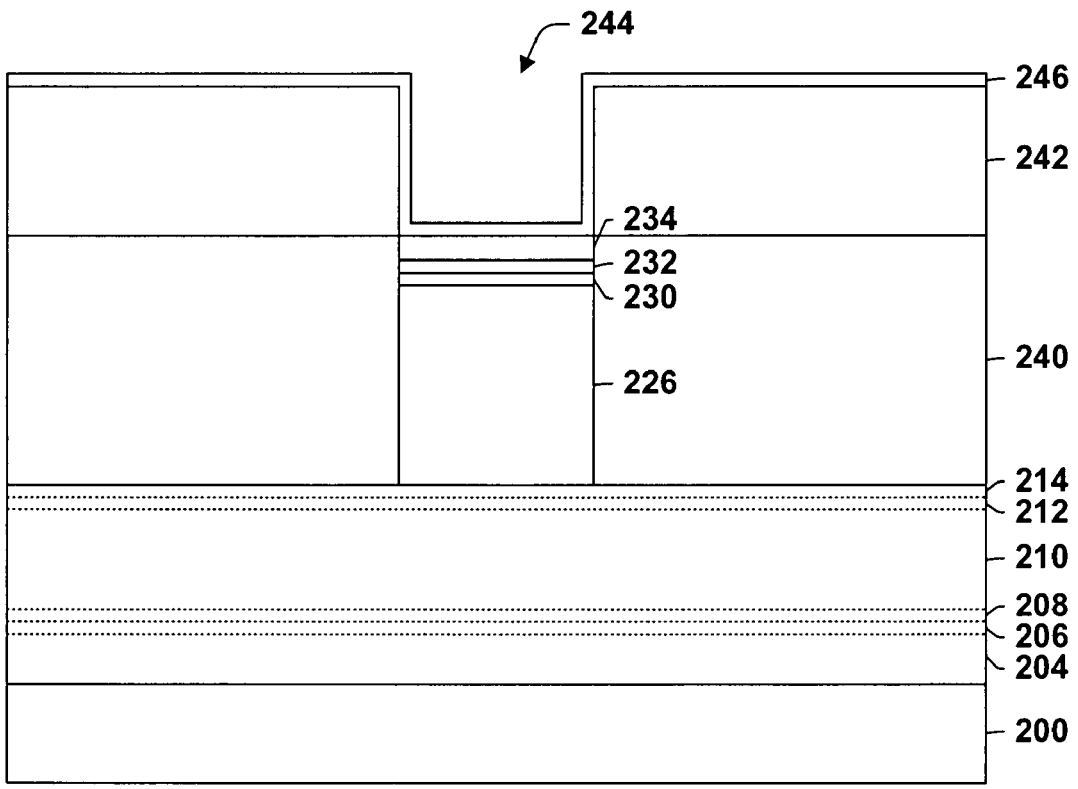
Figure 22:
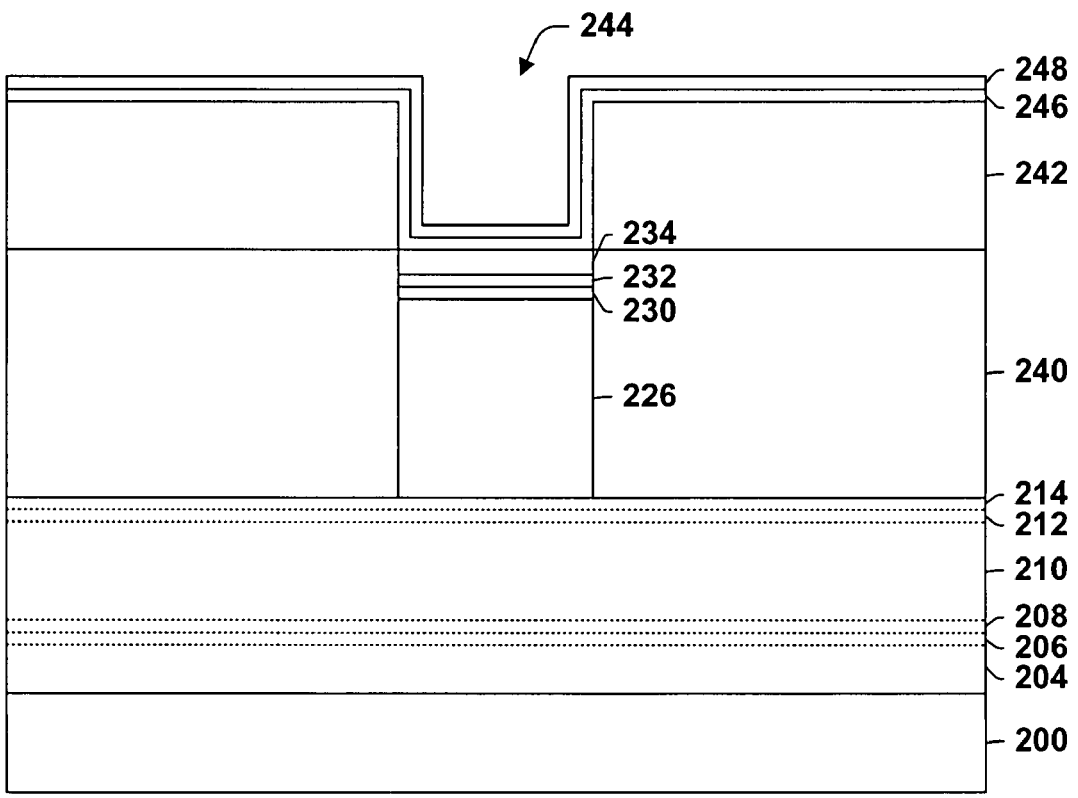

A sixth layer of diffusion barrier material 246 is formed over the second dielectric 242 so as to line the second trench 244 at 144 (FIG. 21). At 146, a seventh layer of diffusion barrier material 248 is formed over the sixth layer of diffusion barrier material 246 thus also lining the second trench 244 (FIG. 22). Like the other diffusion barriers mentioned herein, the sixth and seventh layers of diffusion barrier material 246, 248 can comprise any one or more of the following Ta, TaN, W, WN, TiN, TiSiN, Ru, Mo, Cr, Rh, Re, TaSiN, WSiN, TiW, Ta—W and Ta—Ru, for example. Similarly, the sixth and seventh layers of diffusion barrier material 246, 248 can be formed by a deposition process, such a physical vapor deposition (PVD) and/or chemical vapor deposition (CVD), for example, so that they have a substantially uniform thickness along the sidewalls and bottom of the trench 244.

Additionally, while two layers of diffusion barrier material are illustrated, a single layer of diffusion barrier material may be implemented. Two layers of diffusion barrier material may be advantageous, however, because the sixth layer of diffusion barrier material 246 may provide better adhesion to the dielectric 242 and the hardmask 234, while the seventh layer of diffusion barrier material 248 may exhibit greater diffusion barrier characteristics, for example. Also, where one of the layers of diffusion barrier material 246, 248 has a higher resistivity, for example, then that layer can be made substantially thinner. For example, if the sixth layer of diffusion barrier material 246 changes phases during the deposition process (affecting its lattice structure) so that it becomes more resistive, then that layer can be formed to a thickness that is about 1/10 of the thickness of the seventh layer of diffusion barrier material 248, for example. In this manner, degradation of the overall conductivity of the resulting device is substantially mitigated.

Figure 23:
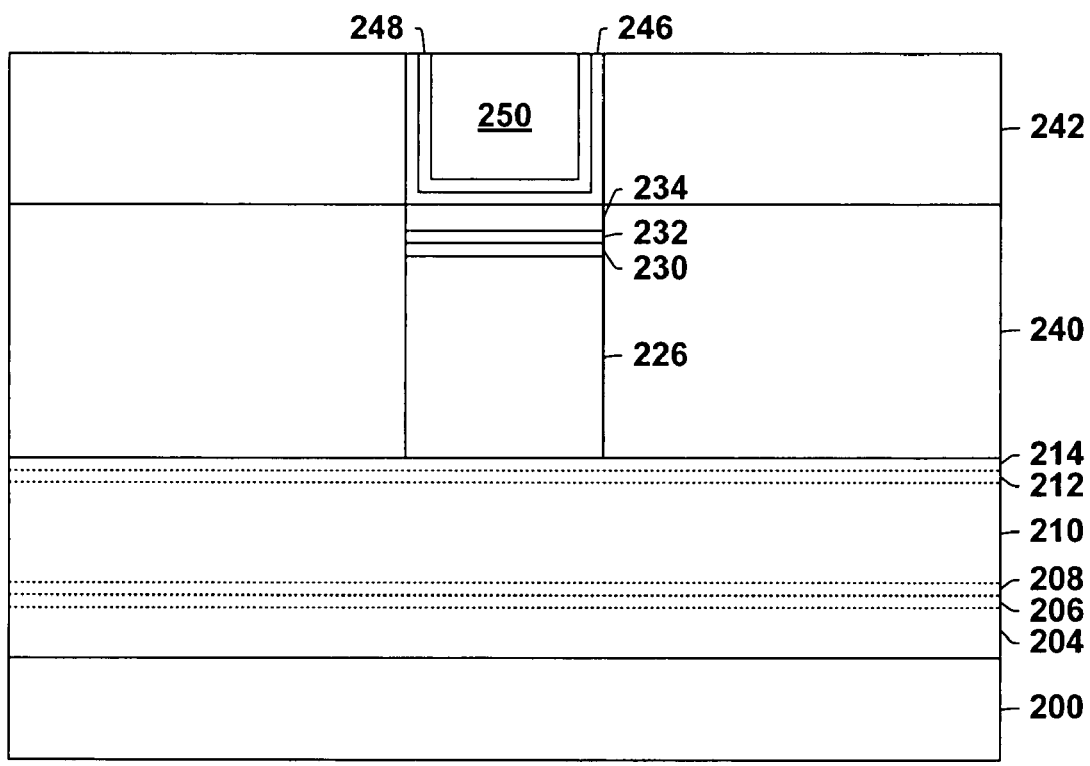

The second trench 244 is then filled with a very low resistivity second conductor 250, such as copper, for example, at 148 (FIG. 23). As with the first conductor 210, this may include forming a seed layer of pure copper followed by an electroplating process to fill the remainder of the second trench 244 with copper, for example. Such a seed layer is a relatively thin (e.g., about 50 nm) highly conductive layer that adheres well to the diffusion barrier material lining the second trench 244, and can be formed by a deposition process, such as physical vapor deposition (PVD), for example. The electroplating process can be performed in a chemical bath to fill the trench 244 from the bottom up with copper. In one example, the second conductor has a width of about 45 nm. With the second trench 244 filled with the second conductor 250, seventh layer of diffusion barrier material 248 and sixth of diffusion barrier material 246, a chemical mechanical polishing (CMP) process is performed at 150 to remove excess amounts of these materials 250, 248, 246 and expose the second dielectric 242 (FIG. 23). As a result, the materials 250, 248, 246 filling the second trench 244 are substantially flush with the top surface of the dielectric 242.

Figure 24:
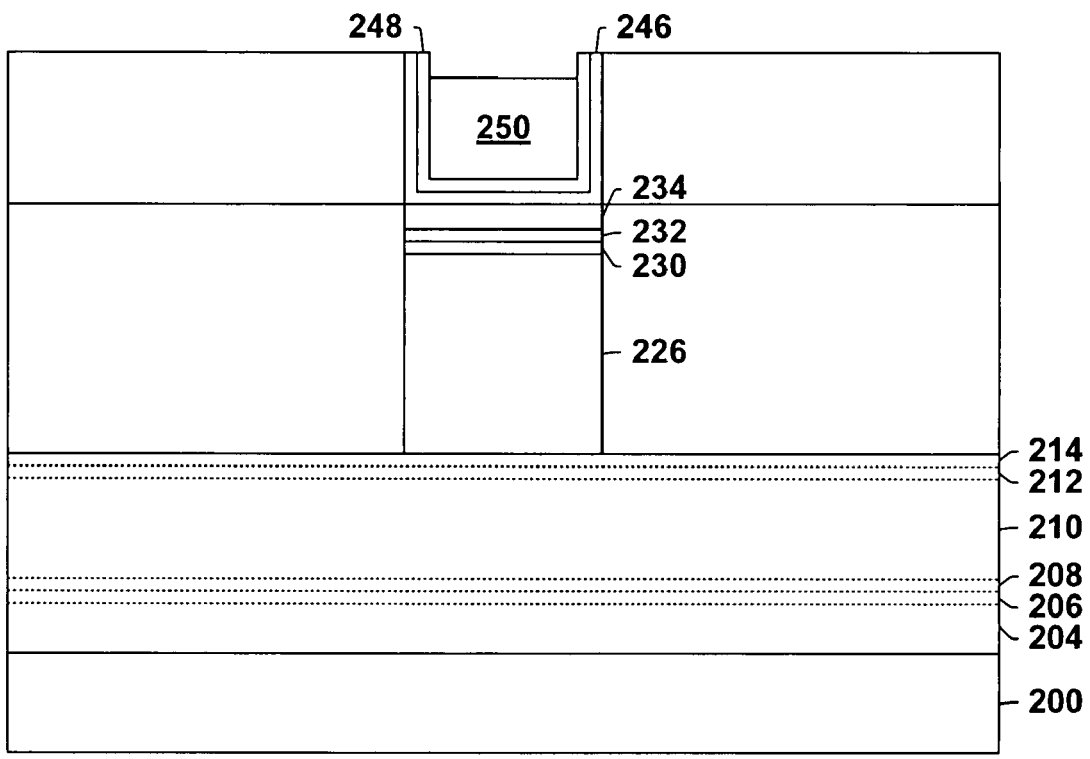

The second conductor 250 is then recessed slightly at 152 (FIG. 24). For example, if the height of the second conductor 250 is about 50 nm, then about 5 nm or about 10% of the second conductor 250 can be removed. One or more techniques can be implemented to recess the second conductor 250. For example, deplating, wet etching and/or chemical mechanical polishing (CMP) can be employed. With deplating, a (reverse) bias is applied to the second conductor 250 along with some light chemicals to remove some of the (upper ions) of the second conductor 250. Sulfuric peroxide can be used to wet etch the second conductor 250. Also, a CMP process can be allowed to run for a slightly extended duration to over polish or dish the second conductor 250.

Figure 25:
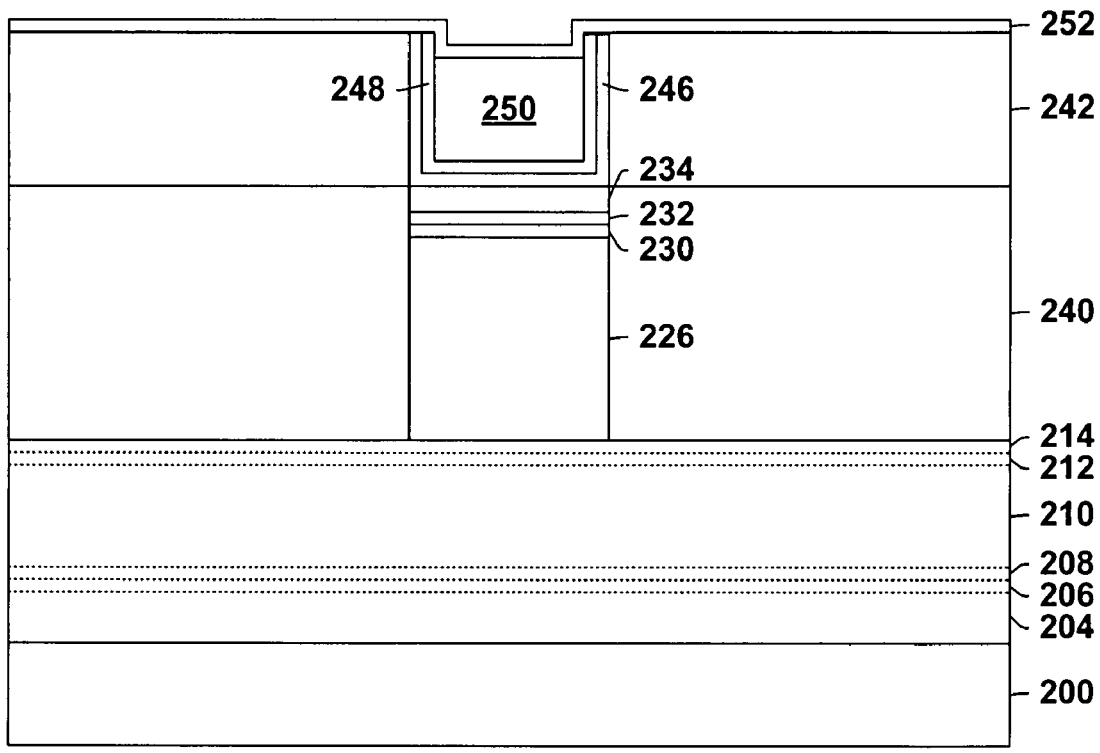
Figure 26:
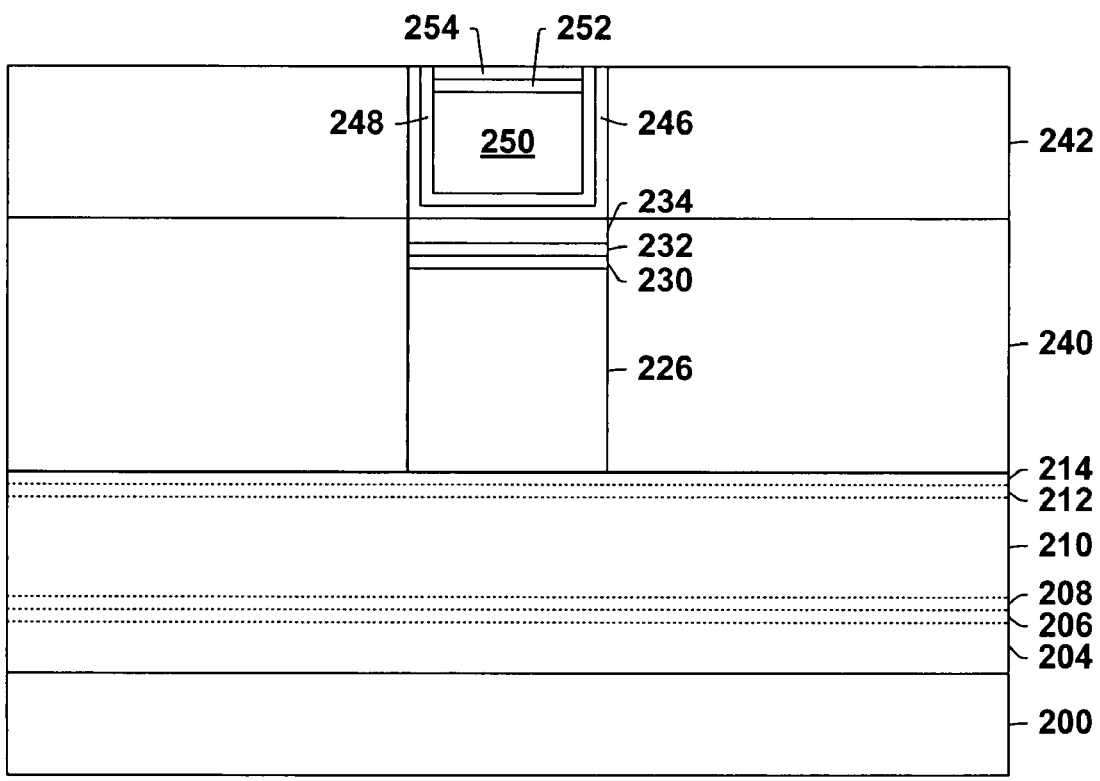

When the second conductor 250 is exposed to the atmosphere some oxidation may occur. Accordingly, the second conductor 250 is cleaned at 154, such as with an argon sputter and/or hydrogen reactive clean, for example. An eighth layer of diffusion barrier material 252 is formed over the dielectric 242 and recessed second conductor 250 at 156 (FIG. 25). A ninth layer of diffusion barrier material 254 is then formed over the eighth layer of diffusion barrier material 252 at 158 (FIG. 26). As with the other diffusion barriers mentioned herein, the eighth and ninth layers of diffusion barrier material 252, 254 can comprise any one or more of the following Ta, TaN, W, WN, TiN, TiSiN, Ru, Mo, Cr, Rh, Re, TaSiN, WSiN, TiW, Ta—W and Ta—Ru, for example. The eighth and ninth layers of diffusion barrier material 252, 254 are planarized (e.g., by CMP) at 160 to be flush with the top surface of the second dielectric 242 (FIG. 26).

It can be appreciated that the eighth and ninth diffusion barriers 252, 254 effectively cap the second conductor 250. Also, while the eighth and ninth diffusion barriers 252, 254 are illustrated, it will be appreciated that a single diffusion barrier can be formed over the second conductor 250. It may be advantageous, however, to have two diffusion barriers 252, 254 because diffusion barrier 252 may exhibit greater diffusion barrier characteristics, while diffusion barrier 254 may afford better adhesion to subsequently applied materials, such as another conductor, for example. The respective thicknesses of the eighth and ninth diffusion barriers 252, 254 may also be adjusted as necessary to mitigate resistivity. It can be appreciated that the sixth diffusion barrier 246 and the ninth diffusion barrier 254 may comprise the same material (or composition of materials), while the seventh diffusion barrier 248 and the eighth diffusion barrier 252 may comprise the same material (or composition of materials). In this manner, the second conductor 250 is effectively surrounded by the same material (or composition of materials) 248, 252, with this material 248, 252 surrounded by another material (or composition of materials) 246, 254.

Figure 27:
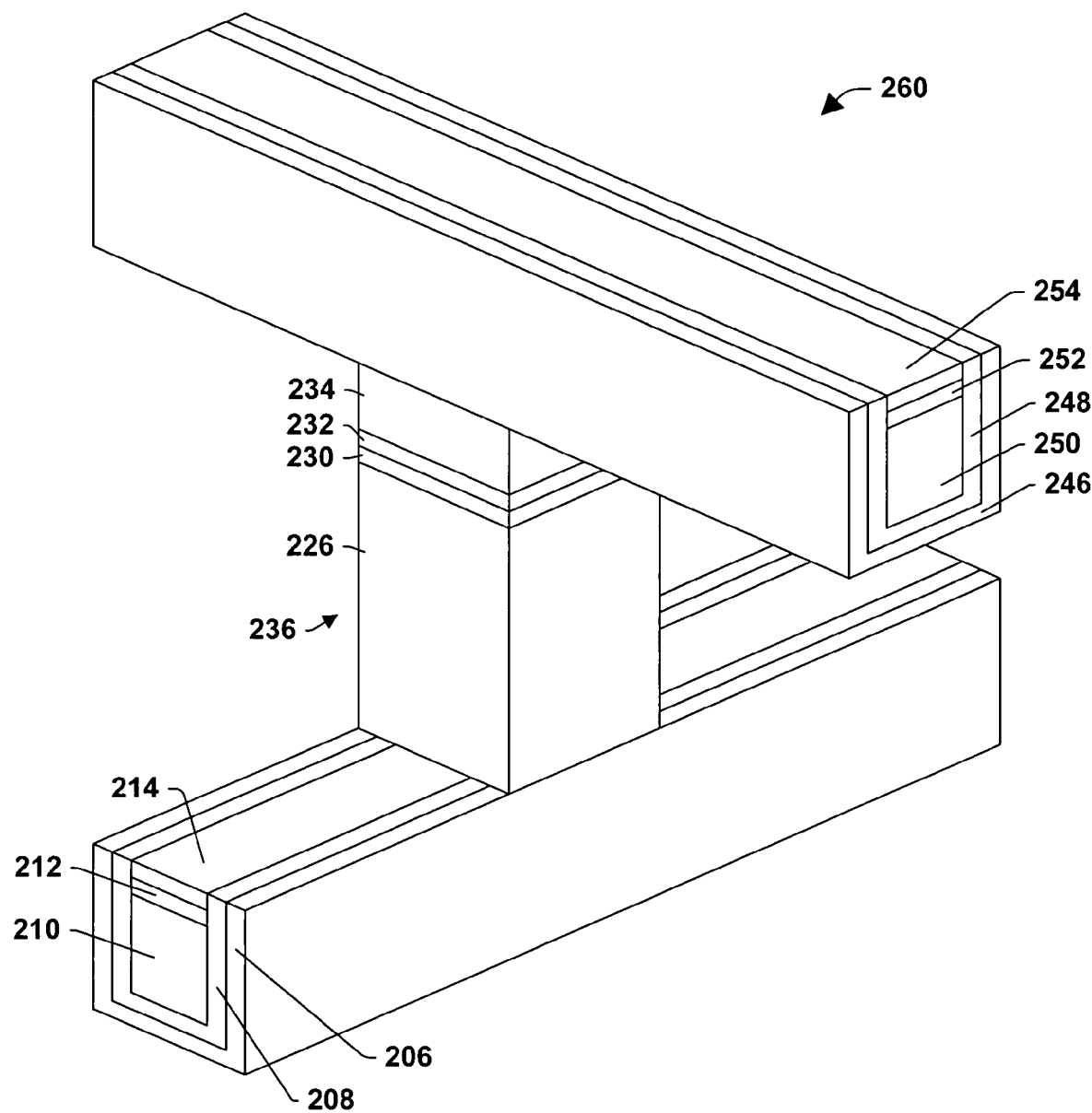
FIG. 27 is a perspective view of a 3D memory cell comprising first and second conductors and a pillar coupled therebetween, where one or more diffusion barriers are formed around the first and second conductors.

FIG. 27 is a perspective view of the 3D memory cell 260 comprising the pillar 236 over the first conductor 210 and surrounding diffusion barriers 206, 208, 212 and 214, and the second conductor 250 and surrounding diffusion barriers 246, 248, 252 and 254 over the pillar 236. In the illustrated example, the first and second conductors 210, 250 are substantially perpendicular to one another. The conductors may, however, be oriented at any suitable angle relative to one another. As alluded to above, to form an array of memory cells, multiple spaced apart pillars can be formed over a plurality of conductors formed concurrently with and parallel to the first conductor 210. Then, a plurality of conductors can be formed over the pillars concurrently with, in the same manner as and substantially parallel to the second conductor 250. This pillar and conductor layering arrangement can continually be repeated to form a stacked or 3D memory array.

Although not illustrated in FIG. 27, it will be appreciated that respective memory cells are electrically isolated from one anther by dielectric material, such as fill material 240 and first and second dielectrics 204, 242 (FIGS. 18, 15 and 26). Also, while the vertical or stacked arrangement of the 3D memory promotes area efficiency, it will be appreciated that this end is advanced even further because the structure is formed over the first dielectric 204 (FIG. 15), rather than directly on the semiconductor substrate 200. In this manner, the 3D memory is electrically isolated from the substrate 200, allowing other features/elements to be formed in the substrate, such as read/write circuitry, for example.

The 3D memory cell 260 operates, at least in part, because the pillar 236 has a first electrical conductivity before a program voltage is applied to the cell and a second electrical conductivity after a program voltage is applied to the cell. More particularly, because the antifuse 230 generally comprises dielectric material it is in a first conductivity state before a program voltage is applied to the cell and a second conductivity state after a program voltage is applied to the cell. That is, when a sufficient voltage is applied to the cell (e.g., a program voltage) via the first and/or second conductors 210, 250, the antifuse 230 ruptures so that current can more easily pass therethrough. The electrical conductivity of the cell 260 is thus significantly increased after the antifuse 230 is ruptured. The cell 260 can thus be considered as storing a binary 0 or 1 before the antifuse is ruptured (unprogrammed) and a binary 1 or 0 after the antifuse is ruptured (programmed). Determining whether the cell 260 is programmed or unprogrammed can be accomplished, for example, by applying a certain voltage to the first and/or second conductors 210, 250 and measuring the current through the cell, and more particularly through the pillar 236, where the applied voltage is known to instill a particular current in the pillar 236 when the antifuse 230 is ruptured, but not when the antifuse 230 is intact.

It will be appreciated that while reference is made throughout this document to exemplary structures in discussing aspects of methodologies described herein (e.g., those structures presented in FIGS. 4-27 while discussing the methodology set forth in FIGS. 1-3), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated.

What is claimed is:

1. A method of forming a memory cell, comprising:
   forming a first trench in a first dielectric over and interfacing with a semiconductor substrate, the first trench not formed all the way through to the semiconductor substrate;
   filling the first trench with a first conductor;
   recessing the first conductor in the first dielectric, such that the first conductor is not substantially flush with the first dielectric;
   filling the recess with a fourth diffusion barrier, such that the fourth diffusion barrier is substantially flush with the first dielectric;
   forming a semiconductor pillar over the fourth diffusion barrier such that the pillar interfaces with the fourth diffusion barrier but not the first conductor;
   forming a second trench in a second dielectric over the pillar;
   forming a sixth diffusion barrier over and interfacing with the pillar in the second trench;
   forming a second conductor over and interfacing with the sixth diffusion barrier in the second trench, the second conductor not interfacing with the pillar;
   recessing the second conductor in the second dielectric, such that the second conductor is not substantially flush with the second dielectric; and
   filling the recess with a ninth diffusion barrier, such that the ninth diffusion barrier is substantially flush with the second dielectric,
      the semiconductor pillar having a first electrical conductivity before a program voltage is applied to the cell and a second electrical conductivity after a program voltage is applied to the cell.

2. The method of claim 1, forming the pillar comprising:
   forming a layer of semiconductor material over a first diffusion barrier and the first dielectric;
   forming a layer of antifuse material over the layer of semiconductor material; and
   patterning the layer of antifuse material and layer of semiconductor material using a non chlorine based etch chemistry, the antifuse being in a first conductivity state before a program voltage is applied to the cell and a second conductivity state after a program voltage is applied to the cell.

3. The method of claim 2, forming the pillar comprising:
   forming a layer of hardmask material over the layer of antifuse material; and
   patterning the layer of hardmask material, layer of antifuse material and layer of semiconductor material.

4. The method of claim 3, the conductors comprising copper, and recessing the first conductor comprising removing about 10% of the first conductor.

5. The method of claim 4, comprising:
   lining the first trench with the first diffusion barrier such that the first conductor is surrounded by diffusion barrier material, the first diffusion barrier being non ferromagnetic.

6. The method of claim 5, forming the pillar comprising:
   forming a layer of fifth diffusion barrier material over the layer of antifuse material;
   forming a layer of hardmask material over the layer of fifth diffusion barrier material; and
   patterning the layer of hardmask material, layer of fifth diffusion barrier material, layer of antifuse material and layer of semiconductor material.

7. The method of claim 6, comprising:
   forming a fifth diffusion barrier over the first diffusion barrier in the recess, such that the fifth diffusion barrier is substantially flush with the first dielectric.

8. The method of claim 7, comprising:
   lining the second trench with the sixth diffusion barrier such that the second conductor is surrounded by diffusion barrier material.

9. The method of claim 8, the pillar not comprising germanium or a germanium alloy.

10. A method of forming a memory cell, comprising:
    forming a first dielectric over and interfacing with a semiconductor substrate;
    forming a first trench in the first dielectric, the first trench not formed all the way through to the semiconductor substrate;
    filling the first trench with a first conductor;
    recessing the first conductor by about 10% in the first dielectric, such that the first conductor is not substantially flush with the first dielectric;
    filling the recess with a fourth diffusion barrier, such that the fourth diffusion barrier is substantially flush with the first dielectric;
    forming a semiconductor pillar over the fourth diffusion barrier such that the pillar interfaces with the fourth diffusion barrier but not the first conductor;

forming a second trench in a second dielectric over the pillar;

forming a sixth diffusion barrier over and interfacing with the pillar in the second trench;

forming a second conductor over and interfacing with the sixth diffusion barrier in the second trench, the second conductor not interfacing with the pillar;

recessing the second conductor in the second dielectric, such that the second conductor is not substantially flush with the second dielectric; and filling the recess with a ninth diffusion barrier, such that the ninth diffusion barrier is substantially flush with the second dielectric, the pillar not comprising germanium or a germanium alloy, the pillar having a first electrical conductivity before a program voltage is applied to the cell and a second electrical conductivity after a program voltage is applied to the cell.

11. The method of claim 10, comprising:

forming the first and second trenches, and the first and second conductors and the fourth, sixth and ninth diffusion barriers formed therein, to have a substantially uniform width.

12. The method of claim 11, forming the semiconductor pillar comprising:

forming a layer of semiconductor material over a first diffusion barrier and the first dielectric;

forming a layer of antifuse material over the layer of semiconductor material; and patterning the layer of antifuse material and layer of semiconductor material, the antifuse being in a first conductivity state before a program voltage is applied to the cell and a second conductivity state after a program voltage is applied to the cell.

13. The method of claim 12, forming the pillar comprising:

forming a layer of hardmask material over the layer of antifuse material; and patterning the layer of hardmask material, layer of antifuse material and layer of semiconductor material using a non chlorine based etch chemistry.

14. The method of claim 13, the conductors comprising copper.

15. The method of claim 14, comprising:

lining the first trench with the first diffusion barrier such that the first conductor is surrounded by diffusion barrier material, the first diffusion barrier being non ferromagnetic.

16. The method of claim 15, forming the pillar comprising:

forming a layer of fifth diffusion barrier material over the layer of antifuse material;

forming a layer of hardmask material over the layer of fifth diffusion barrier material; and patterning the layer of hardmask material, layer of fifth diffusion barrier material, layer of antifuse material and layer of semiconductor material.

17. The method of claim 16, comprising:

forming a fourth diffusion barrier over the first diffusion barrier in the recess, such that the fourth diffusion barrier is substantially flush with the first dielectric.

18. The method of claim 17, comprising:

lining the second trench with the sixth diffusion barrier such that the second conductor is surrounded by diffusion barrier material.

19. A method of forming a memory cell, comprising:

filling a first trench in a first dielectric over and interfacing with a semiconductor substrate with a first copper conductor, the first trench not formed all the way through to the semiconductor substrate;

recessing the first conductor in the first dielectric, such that the first conductor is not substantially flush with the first dielectric;

filling the recess with a fourth diffusion barrier, such that the fourth diffusion barrier is substantially flush with the first dielectric forming a layer of semiconductor material over the first conductor and the first dielectric;

forming a layer of antifuse material over the layer of semiconductor material;

forming a layer of hardmask material over the layer of antifuse material;

patterning the layer of hardmask material, layer of antifuse material and layer of semiconductor material using a non chlorine based etch chemistry to form a semiconductor pillar such that the pillar interfaces with the fourth diffusion barrier but not the first conductor;

forming a second trench in a second dielectric over the pillar;

forming a sixth diffusion barrier over and interfacing with the pillar in the second trench;

forming a second copper conductor over and interfacing with the sixth diffusion barrier in the second trench, the second conductor not interfacing with the pillar;

recessing the second conductor in the second dielectric, such that the second conductor is not substantially flush with the second dielectric; and filling the recess with a ninth diffusion barrier, such that the ninth diffusion barrier is substantially flush with the second dielectric, the antifuse being in a first conductivity state before a program voltage is applied to the cell and a second conductivity state after a program voltage is applied to the cell.

20. The method of claim 19, comprising:

forming the first and second trenches, and the first and second conductors and the fourth, sixth and ninth diffusion barriers formed therein to have a substantially uniform width, and recessing the first conductor by about 10%.

21. The method of claim 20, comprising:

lining the first trench with a first diffusion barrier such that the first conductor is surrounded by diffusion barrier material, the first diffusion barrier being non ferromagnetic.

22. The method of claim 21, comprising:

forming a layer of fifth diffusion barrier material over the layer of antifuse material;

forming a layer of hardmask material over the layer of fifth diffusion barrier material; and patterning the layer of hardmask material, layer of fifth diffusion barrier material, layer of antifuse material and layer of semiconductor material to form the pillar.

23. The method of claim 22, comprising:

forming a fourth diffusion barrier over the first diffusion barrier in the recess, such that the fourth diffusion barrier is substantially flush with the first dielectric.

24. The method of claim 23, comprising:

lining the second trench with the sixth diffusion barrier such that the second conductor is surrounded by diffusion barrier material.

25. The method of claim 24, the semiconductor not comprising germanium or a germanium alloy.

* * * * *